US011811191B2

(12) United States Patent
Hirayama

(10) Patent No.: US 11,811,191 B2
(45) Date of Patent: Nov. 7, 2023

(54) OPTICAL SEMICONDUCTOR DEVICE AND CARRIER

(71) Applicant: SUMITOMO ELECTRIC DEVICE INNOVATIONS, INC., Yokohama (JP)

(72) Inventor: Masahiro Hirayama, Yokohama (JP)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 465 days.

(21) Appl. No.: 16/998,008

(22) Filed: Aug. 20, 2020

(65) Prior Publication Data
US 2021/0057877 A1 Feb. 25, 2021

(30) Foreign Application Priority Data

Aug. 22, 2019 (JP) .................................. 2019-152028

(51) Int. Cl.
*H01S 5/02345* (2021.01)
*H01S 5/026* (2006.01)
*H01S 5/0239* (2021.01)

(52) U.S. Cl.
CPC ........ *H01S 5/02345* (2021.01); *H01S 5/0239* (2021.01); *H01S 5/0261* (2013.01)

(58) Field of Classification Search
CPC ... H01S 5/02345; H01S 5/0239; H01S 5/0261
See application file for complete search history.

(56) References Cited

U.S. PATENT DOCUMENTS

| 2013/0010343 A1* | 1/2013 | Hirayama | G02F 1/0121 |
| | | | 359/238 |
| 2016/0129513 A1* | 5/2016 | Oka | B23K 3/0623 |
| | | | 372/38.07 |
| 2018/0123695 A1* | 5/2018 | Kubota | G02B 6/43 |
| 2018/0123697 A1* | 5/2018 | Kubota | H04B 10/516 |

FOREIGN PATENT DOCUMENTS

JP H5-251939 A 9/1993

\* cited by examiner

*Primary Examiner* — Yuanda Zhang
(74) *Attorney, Agent, or Firm* — Oliff PLC

(57) ABSTRACT

Disclosed is an optical semiconductor device including a semiconductor laser chip, an insulation substrate, a ground pattern, a mounted pattern, a resistor and an extension ground pattern. The insulation substrate has a surface mounting the semiconductor laser chip thereon. The ground pattern and the mounted pattern are provided on the surface. The mounted pattern has an opposite side opposite to the ground pattern. The resistor is disposed such that a side edge of the resistor separates from an extension region of the opposite side. The extension ground pattern is positioned in the extension region of the opposite side and is electrically connected to the ground pattern. The capacitor is disposed on the mounted pattern.

8 Claims, 10 Drawing Sheets

OPTICAL SEMICONDUCTOR DEVICE AND CARRIER

CROSS-REFERENCE TO RELATED APPLICATION

This application is based upon and claims the benefit of priority from Japanese Patent Application No. 2019-152028, filed on Aug. 22, 2019, the entire contents of which are incorporated herein by reference.

TECHNICAL FIELD

The present disclosure relates to an optical semiconductor device and a carrier.

BACKGROUND

JPH05-251939A discloses a coplanar waveguide in which a ground pattern is provided on both sides of one signal line as a structure for transmitting a high frequency signal.

SUMMARY

The disclosure provides an optical semiconductor device. The optical semiconductor device includes a semiconductor laser chip, an insulation substrate, a ground pattern, a mounted pattern, a resistor, an extension ground pattern, and a capacitor. The insulation substrate has a surface mounting the semiconductor laser chip thereon. The ground pattern and the mounted pattern are provided on the surface. The mounted pattern has an opposite side opposite to the ground pattern. The resistor is disposed such that a side edge of the resistor separates from an extension region of the opposite side. The extension ground pattern is positioned in the extension region of the opposite side and is electrically connected to the ground pattern. The capacitor is disposed on the mounted pattern.

BRIEF DESCRIPTION OF THE DRAWINGS

The foregoing and other purposes, aspects and advantages will be better understood from the following detailed description of embodiments of the disclosure with reference to the drawings, in which.

DETAILED DESCRIPTION

Figure 1:
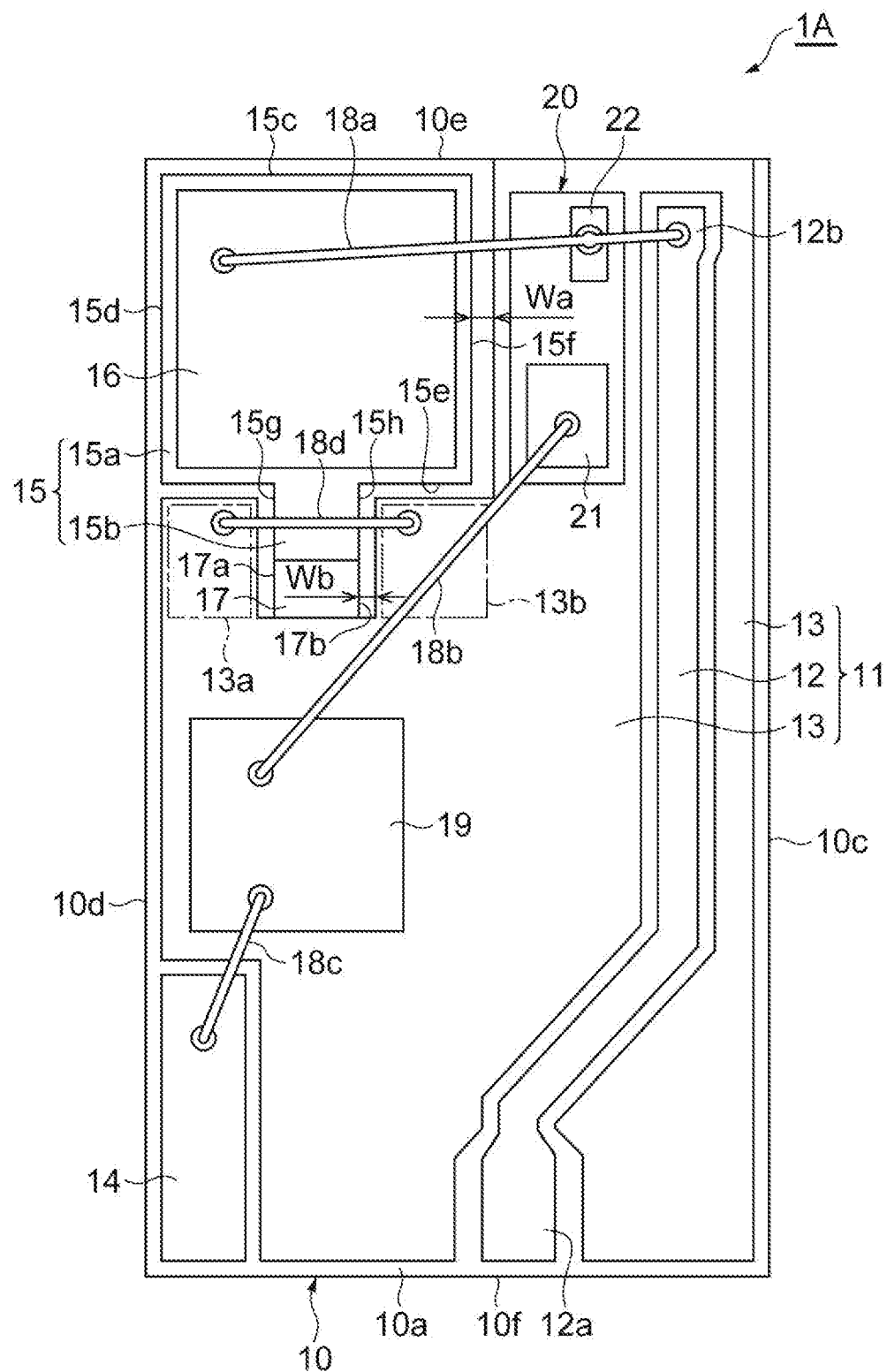
FIG. 1 is a plan view illustrating a configuration of an optical semiconductor device according to an embodiment of the disclosure.

Problem to be Solved by the Present Disclosure

A semiconductor laser chip may be mounted on a surface of an insulation substrate in an optical transmitter of an optical communication system. A high-frequency drive signal is provided to the semiconductor laser chip via a transmission line such as a coplanar line provided on the surface of the insulation substrate. In recent years, as the capacity of the optical communication system has increased, the frequency of drive signals has further increased. For this reason, the optical transmitter is required to have a stable characteristic over a wide frequency band, and in particular, an electrical-optical conversion characteristic (EO characteristic) is required to have a flat characteristic with few discontinuity points over a wide frequency band.

Effect of the Present Disclosure

According to one aspect of the disclosure, it is possible to reduce discontinuity points, so that an EO characteristic can be close to more flat.

Description of Embodiments of the Present Disclosure

Embodiments of the present disclosure will be listed and described. An optical semiconductor device according to an embodiment of the present disclosure includes a semiconductor laser chip, an insulation substrate, a ground pattern, a mounted pattern, a resistor, an extension ground pattern, and a capacitor. The insulation substrate has a surface mounting the semiconductor laser chip thereon. The ground pattern and the mounted pattern are provided on the surface. The mounted pattern has an opposite side opposite to the ground pattern. The resistor is disposed such that a side edge of the resistor separates from an extension region of the opposite side. The extension ground pattern is positioned in the extension region of the opposite side and is electrically connected to the ground pattern. The capacitor is disposed on the mounted pattern.

As one embodiment, the extension ground pattern may be a pair of extension ground patterns, and the pair of extension ground patterns may sandwich the resistor therebetween. The optical semiconductor device may further include a bonding wire that connects the pair of extension ground patterns positioned at both sides of the resistor to each other. In the optical semiconductor device, a protrusion portion having a narrower width than the ground pattern may be disposed between the ground pattern and the resistor. In the optical semiconductor device, one end of the resistor may be electrically connected to the mounted pattern and the other end of the resistor may be electrically connected to a protrusion portion extended from the ground pattern. The protrusion portion may have a narrower width than the mounted pattern.

An optical semiconductor device according to an embodiment of the present disclosure includes a semiconductor laser chip, an insulation substrate, a ground pattern, a mounted pattern, a resistor, and a capacitor. The insulation substrate has a surface mounting the semiconductor laser chip thereon. The ground pattern and the mounted pattern are provided on the surface. The mounted pattern comprises a main region and a protrusion portion having a narrower width than the main region. The protrusion portion has a side edge on an extension of an opposite side of the main region opposite to the ground pattern. The resistor is disposed on an extension of the protrusion portion wherein a side of the resistor is opposite to the ground pattern. The capacitor is disposed on the main region of the mounted pattern.

As one embodiment, the optical semiconductor device may further include an extension ground pattern disposed to be opposite to the ground pattern so as to sandwich the protrusion portion and the resistor therebetween. The extension ground pattern may be electrically connected to the ground pattern.

A carrier according to an embodiment of the present disclosure includes an insulation substrate having a surface configured to mount a semiconductor laser chip thereon, a ground pattern provided on the surface, a mounted pattern provided on the surface, the mounted pattern having a upper surface configured to dispose a capacitor thereon and an opposite side opposite to the ground pattern, a region configured to dispose a resistor that is connected to the mounted pattern thereon, and an extension ground pattern positioned on an extension region of the opposite side, the extension ground pattern being electrically connected to the ground pattern.

As one embodiment, the extension ground pattern of the carrier may be a pair of extension ground patterns, and the pair of extension ground patterns may sandwich the region wherein the resistor is disposed therebetween. In the carrier, an extension portion having a narrower width than the mounted pattern may be disposed between the mounted pattern and the region where the resistor is disposed.

A carrier according to an embodiment of the present disclosure includes an insulation substrate having a surface configured to mount a semiconductor laser chip thereon, a ground pattern provided on the surface, a mounted pattern provided on the surface, the mounted pattern comprising a upper surface configured to dispose a capacitor thereon, a main region, and a protrusion portion having a narrower width than the main region, wherein the protrusion has a side edge on an extension of an opposite side of the main region opposite to the ground pattern, and a region configured to dispose a resistor thereon, the region located on an extension of the protrusion portion.

As one embodiment, the carrier may further include an extension ground pattern disposed to be opposite to the ground pattern so as to sandwich the region where the protrusion portion and the resistor are disposed. The extension ground pattern may be electrically connected to the ground pattern.

An optical semiconductor device according to an embodiment of the present disclosure includes a semiconductor laser chip, an insulation substrate, a ground pattern, a transmission line, a mounted pattern, a capacitor, and a resistor. The semiconductor laser chip includes an electrode pad. The insulation substrate has a surface mounting the semiconductor laser chip thereon. The ground pattern is provided on the surface. The transmission line is provided on the surface and connected to the electrode pad of the semiconductor laser chip via a first wire. The mounted pattern is provided on the surface next to the ground pattern. The capacitor has a first electrode and a second electrode. The first electrode is connected to the electrode pad of the semiconductor laser chip via a second wire and the second electrode is connected to the mounted pattern. The resistor is provided on the surface. The resistor has a first end connected to the mounted pattern and a second end connected to the ground pattern. The ground pattern includes at least one extension ground pattern arranged on both sides or one side of the resistor to extend along the resistor. A first width between the mounted pattern and the ground pattern and a second width between the resistor and the at least one extension ground pattern are 20 µm or more and 60 µm or less.

In this optical semiconductor device, the semiconductor laser chip is mounted on the surface of the insulation substrate, and a high frequency drive signal is supplied to the semiconductor laser chip via a transmission line and a wire. In order to terminate a high frequency signal path, the capacitor and the resistor are provided on the surface of the insulation substrate. The distal end of the wire extending from the transmission line to the semiconductor laser chip further extends onto the capacitor and is connected to one electrode of the capacitor. The other electrode of the capacitor is connected to the ground pattern via the mounted pattern and the resistor.

In such an optical semiconductor device, the present inventor has found that the interval of the gap between the mounted pattern and the resistor connected to the capacitor and the ground pattern greatly affects the EO characteristic. That is, if the gap between the mounted pattern and the ground pattern and the gap between the resistor and the ground pattern are partially greatly vacant, the EO characteristic partially dips (becomes discontinuous) due to resonance caused by a stray capacitance generated in the portions. Accordingly, the flatness of the EO characteristic is impaired. Therefore, in the above-described optical semiconductor device, the width of the gap between the mounted pattern and the ground pattern except for the region where the resistor is provided and the width of the gap between the resistor and the ground pattern except for the portions connected to each other are set to 20 µm or more and 60 µm or less at any position of the gaps. According to the knowledge of the inventor, this reduces the dip in the EO characteristic, and it is possible to reduce the discontinuity points, so that the EO characteristic can be close to more flat.

As one embodiment, the at least one extension ground pattern may be a pair of extension ground patterns, and the pair of extension ground patterns may sandwich the resistor therebetween. In this embodiment, each second width between the resistor and each of the pair of extension ground patterns may be 20 µm or more and 60 µm or less in any area. The pair of extension ground patterns and the resistor may consist of a coplanar line (coplanar circuit). In this case, it is possible to stabilize the high frequency characteristic and further reduce the dip in the EO characteristic.

As one embodiment, the at least one extension ground pattern may be one extension ground pattern, and the one extension ground pattern may be arranged on the one side of the resistor.

As one embodiment, the mounted pattern may include a main region and a protrusion portion extending from the main region. The protrusion portion may be connected to the first end of the resistor. In this embodiment, the at least one extension ground pattern may be provided both sides or one side of the protrusion portion, and a third width between the protrusion portion and the at least one extension ground pattern may be 20 µm or more and 60 µm or less in any area. In this case, the protrusion portion is provided from the viewpoint of manufacturing. According to the knowledge of the inventor, in a case where a protrusion portion is provided, by configuring a coplanar line (coplanar circuit) with the extension ground pattern(s) located on both sides or one side of the protrusion portion, the high frequency signal is transmitted through the coplanar line to reduce radiation loss, and thus, a high frequency characteristic in the protrusion portion is stabilized, so that the dip in the EO characteristic can be further reduced. In this case, the width of the gap between the protrusion portion and the extension ground pattern(s) is 20 µm or more and 60 µm or less at any position. The second electrode of the capacitor may be connected to the main region of the mounted pattern.

As one embodiment, a pair of extension ground patterns being the at least one extension ground pattern may be arranged on both sides of the protrusion portion or the resistor, and the pair of extension ground patterns may be electrically connected each other via a third wire such that the third wire crosses the protrusion portion. In this case, the high frequency characteristic in the protrusion portion is further stabilized, and thus, it is possible to more effectively reduce the dip in the EO characteristic.

As one embodiment, the mounted pattern may include a main region where the second electrode of the capacitor is connected, and the resistor may be directly connected to the main region.

As one embodiment, the transmission line may be provided along the semiconductor laser chip, and may consist of the coplanar line by a signal line and two portions of the ground pattern arranged on both sides of the signal line. In this case, it is possible to stabilize the high frequency characteristic and further reduce the dip in the EO characteristic.

As one embodiment, the capacitance of the capacitor may be 90 nF or more and 120 nF or less. In such a capacitor having a relatively large capacitance, the size of the capacitor also becomes large, and the mounted pattern thereof also becomes wide. The effect of the optical semiconductor device described above is particularly effective in such a case. [Detailed Description of Embodiments of the Present Disclosure]

Specific examples of the optical semiconductor device according to an embodiment of the disclosure will be described below with reference to the drawings. The present invention is not limited to these examples, but the invention is defined by the scope of the claims and is intended to include meanings equivalent to the scope of the claims and all modifications within the scope. In the following description, the same reference numbers are assigned to the same elements in the description of the drawings, and redundant description will be omitted.

FIG. 1 is a plan view illustrating a configuration of an optical semiconductor device 1A according to an embodiment of the disclosure.

The optical semiconductor device 1A is mounted in an optical transmitter of an optical communication system. As illustrated in FIG. 1, the optical semiconductor device 1A includes a carrier (insulation substrate) 10, a coplanar line 11, a ground pattern 13, a bias pattern 14, a mounted pattern 15, capacitors 16 and 19, a thin film resistor (TFR) 17, bonding wires 18a to 18d, and a semiconductor laser chip 20.

The semiconductor laser chip 20 has a monolithic structure in which a laser diode and an optical modulator are integrated on a common substrate. The semiconductor laser chip 20 has a pad 21 connected to an anode electrode for supplying a bias current to the laser diode, and a pad 22 connected to an anode electrode for supplying a drive current to the optical modulator. These pads 21 and 22 are formed by, for example, Au plating.

The carrier 10 is a quadrangular plate-shaped (substrate-shaped) member and has a surface 10a, a pair of side faces 10c and 10d facing each other, and a pair of end faces 10e and 10f facing each other. The pair of side faces 10c and 10d respectively extend along a first direction (hereinafter, referred to as a vertical direction) and are arranged side by side in a second direction (hereinafter, referred to as a lateral direction) intersecting the vertical direction. The pair of end faces 10e and 10f respectively extend along the lateral direction so as to connect the side face 10c and the side face 10d and are arranged side by side in the vertical direction. In the carrier 10, the semiconductor laser chip 20 is mounted on the surface 10a at a position near the end face 10e. The carrier 10 is made of a dielectric material such as aluminum nitride (AlN). The thickness of the carrier 10 is 0.3 mm or more, and in one example, the thickness is 0.45 mm. The lateral size of the carrier 10 is, for example, 1.0 mm, and the longitudinal size of the carrier 10 is, for example, 2.0 mm.

The coplanar line 11 is an example of a transmission line. The form of the transmission line in the embodiment is not limited to the coplanar line, and various other line forms can be employed. The coplanar line 11 is configured to include a signal line 12 and two portions of the ground pattern 13. The signal line 12 is a conductive metal film that extends in the vertical direction on the surface 10a from a position near the end face 10f to a position near the end face 10e. A portion near the end face 10f becomes a pad 12a for wire bonding, and one end of a bonding wire for being electrically connected to a lead terminal of a package (not illustrated) is joined to the pad 12a. A portion near the other end face 10e becomes a pad 12b for wire bonding, and the pad 12b and the pad 22 of the semiconductor laser chip 20 are electrically connected via the bonding wire 18a.

A portion (including the pad 12b) closer to the end face 10e than the center of the signal line 12 in the vertical direction is arranged between the semiconductor laser chip 20 and the side face 10c. A portion (including the pad 12a) closer to the end face 10f than the center of the signal line 12 in the vertical direction is slightly apart from the side face 10c, but the distance from the side face 10c is shorter than the distance from the side face 10d. Therefore, as a whole, the signal line 12 is provided to be biased in a region close to the one side face 10c.

The ground pattern 13 is a conductive metal film provided on the surface 10a with a uniform interval on both sides of the signal line 12 in the lateral direction. In the embodiment, the ground pattern 13 is provided on almost the entire region on the surface 10a except for the formation regions of the signal line 12, the bias pattern 14, and the mounted pattern 15. A first mounting region for the semiconductor laser chip 20 and a second mounting region for the capacitor 19 are defined in the ground pattern 13 located on the side face 10d side with respect to the signal line 12. The semiconductor laser chip 20 is mounted on the first mounting region of the ground pattern 13, and the back surface electrode (cathode) of the semiconductor laser chip 20 is conductively connected to the ground pattern 13. The capacitor 19 is mounted on the second mounting region of the ground pattern 13, and the back surface electrode of the capacitor 19 is conductively connected to the ground pattern 13. One end of each bonding wire for being electrically connected to a ground lead terminal of a package (not illustrated) is joined to each of the portions of the ground pattern 13 located on both sides of the signal line 12.

The bias pattern 14 is a conductive metal film provided on the surface 10a at positions near the side face 10d and near the end face 10f. The bias pattern 14 and the front surface electrode of the capacitor 19 are electrically connected via the bonding wire 18c. The front surface electrode of the capacitor 19 and the pad 21 of the semiconductor laser chip 20 are electrically connected via the bonding wire 18b. In addition, one end of a bonding wire for being electrically connected to a power supply lead terminal of a package (not illustrated) is joined to the bias pattern 14. A bias current is supplied to the pad 21 of the semiconductor laser chip 20 via the bias pattern 14 and the bonding wires 18b and 18c. The capacitor 19 functions as a bypass capacitor for reducing noise of the bias current. The capacitance value of the capacitor 19 is, for example, 2 nF (nano-farad).

The mounted pattern 15, the capacitor 16, and the thin film resistor 17 constitute an impedance matching circuit for terminating the transmission path of the high frequency signal. The mounted pattern 15 is a conductive metal film provided on the surface 10a at positions near the end face 10e and near the side face 10d. The mounted pattern 15 is provided next to the ground pattern 13 located on the side face 10d side with respect to the signal line 12. "Two patterns are provided next to each other" denotes a state where no other pattern is provided between the patterns and the edges thereof face each other via a dielectric or air.

The mounted pattern 15 includes a main region 15a and a protrusion portion 15b. The main region 15a has a planar shape such as a rectangular shape or a square shape, and the capacitor 16 is mounted on the main region 15a. Therefore, the area of the main region 15a is larger than the area of the back surface of the capacitor 16. A side 15c of the main region 15a extends along the end face 10e, and the other side 15d of the main region 15a extends along the side face 10d. A side 15e of the main region 15a opposite to the side 15c and a side 15f of the main region 15a opposite to the side 15d face the ground pattern 13 via the gap and extend along the ground pattern 13. The protrusion portion 15b is a portion electrically connected to the ground pattern 13 via the thin film resistor 17 and is formed by allowing a part of the mounted pattern 15 to protrude. The protrusion portion 15b of the embodiment protrudes in the vertical direction from the central portion of the side 15e of the main region 15a toward the thin film resistor 17. Both a pair of side edges 15g and 15h of the protrusion portion 15b extend in the vertical direction.

The thin film resistor 17 is a film-shaped resistor formed on the surface 10a. The constituent material of the thin film resistor 17 is, for example, tantalum nitride (TaN). The resistance value of the thin film resistor 17 is, for example, 50Ω. The thin film resistor 17 extends in the vertical direction and is provided between the protrusion portion 15b and the ground pattern 13. One end of the thin film resistor 17 is electrically connected to the protrusion portion 15b by being in contact with the protrusion portion 15b. The other end of the thin film resistor 17 is electrically connected to the ground pattern 13 by being in contact with the ground pattern 13. More specifically, the thin film resistor 17 has a planar shape such as a square shape or a rectangular shape. One side of the thin film resistor 17 extends in the lateral direction and is in contact with the protrusion portion 15b. The other side facing the one side of the thin film resistor 17 extends in the lateral direction and is in contact with the ground pattern 13. A pair of side edges 17a and 17b of the thin film resistor 17 extending in the vertical direction face the ground pattern 13 via a gap and extend along the ground pattern 13. In one example, as viewed in plan view, the side edge 17a and the side edge 15g are located on a straight line, and the side edge 17b and the side edge 15h are located on a straight line.

The ground pattern 13 includes a pair of extension ground patterns 13a and 13b. The extension ground patterns 13a and 13b are located on both sides of the protrusion portion 15b and the thin film resistor 17 in the lateral direction. As a result, the protrusion portion 15b and the extension ground patterns 13a and 13b constitute a coplanar line, and the thin film resistor 17 and the extension ground patterns 13a and 13b constitute a coplanar line. Specifically, the extension ground pattern 13a has a planar shape such as a square shape or a rectangular shape. One side of the extension ground pattern 13a faces the side edge 15g of the protrusion portion 15b and the side edge 17a of the thin film resistor 17 and extends along the side edges 15g and 17a. In addition, the other side of the extension ground pattern 13a faces the side 15e of the main region 15a and extends along the side 15e. One side of the extension ground pattern 13b faces the side edge 15h of the protrusion portion 15b and the side edge 17b of the thin film resistor 17 and extends along the side edges 15h and 17b. In addition, the other side of the extension ground pattern 13b faces the side 15e of the main region 15a and extends along the side 15e. The extension ground patterns 13a and 13b sandwich the protrusion portion 15b and the resistor 17 therebetween.

Figure 2:
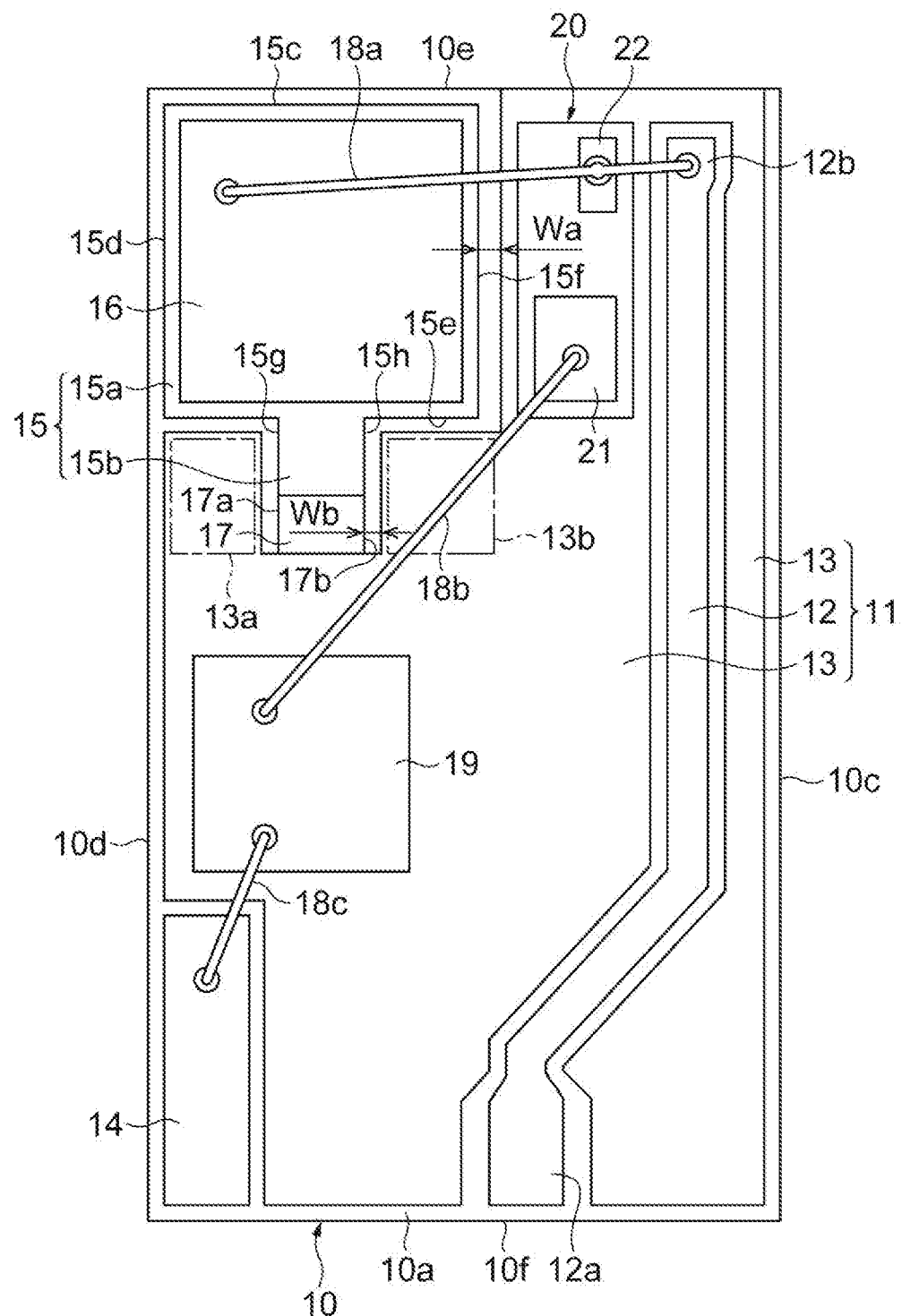
FIG. 2 is a plan view illustrating a configuration where one bonding wire is omitted in the optical semiconductor device illustrated in FIG. 1.

The bonding wire 18d extends laterally across the protrusion portion 15b and electrically connects the pair of extension ground patterns 13a and 13b to each other. Therefore, the potential of the bonding wire 18d becomes the same as that of the ground pattern 13. As illustrated in FIG. 2, the bonding wire 18d may be omitted as appropriate.

The width Wa of the gap between the mounted pattern 15 and the ground pattern 13 is $\lambda/4$ or less ($\lambda$ is the wavelength of the resonance frequency) which is the resonance frequency at any position of the gap except for the region where the thin film resistor 17 is provided and specifically 20 μm or more and 60 μm or less. That is, the width of the gap between the side 15f of the main region 15a and the ground pattern 13 and the width of the gap between the side 15e of the main region 15a and the ground pattern 13 are both 20 μm or more and 60 μm or less. The width of the gap between the side edge 15g of the protrusion portion 15b and the ground pattern 13 and the width of the gap between the side edge 15h of the protrusion portion 15b and the ground pattern 13 are also both 20 μm or more and 60 μm or less. In one example, these widths are all set to a constant size. In one example, the width of the gap is 40 μm. In FIGS. 1 and 2, as long as the width of the gap between each of the protrusion portion 15b and the thin film resistor 17 and the extension ground pattern 13a (13b) is 20 μm or more and 60 μm or less, the lateral widths (widths in the direction intersecting the side edge) of the protrusion portion 15b and the thin film resistor 17 may be different from each other. For example, the lateral width of the protrusion portion 15b may be larger or smaller than the lateral width of the thin film resistor 17. The extension ground pattern 13b may be formed and the extension ground pattern 13a may not be formed in the embodiments of FIGS. 1 and 2.

The width Wb of the gap between the thin film resistor 17 and the ground pattern 13 is $\lambda/4$ or less at any position of the gap except for the portions connected to each other and specifically 20 μm or more and 60 μm or less. That is, the width of the gap between the side edge 17a of the thin film resistor 17 and the ground pattern 13 and the width of the gap between the side edge 17b of the thin film resistor 17 and the ground pattern 13 are both 20 µm or more and 60 µm or less. In one example, these widths are all set to a constant size.

The signal line 12, the ground pattern 13, the bias pattern 14, and the mounted pattern 15 described above are all formed by Au plating and include a Ti film, a Pt film, and an Au film from the carrier 10 side. The thickness of the Ti film is, for example, 0.1 µm. The thickness of the Pt film is, for example, 0.2 µm. The thickness of the Au film is, for example, 1 µm.

The capacitor 16 is mounted on the mounted pattern 15. Specifically, the capacitor 16 has a front surface electrode and a back surface electrode provided on the side opposite to the front surface electrode. The back surface electrode of the capacitor 16 faces the main region 15a of the mounted pattern 15 and is conductively joined to the main region 15a via a conductive adhesive such as solder. The front surface electrode of the capacitor 16 is electrically connected to the pad 22 of the semiconductor laser chip 20 via the bonding wire 18a. The capacitance value of the capacitor 16 is, for example, 90 nF or more and 120 nF or less, and in one example, the capacitance value is 100 nF. The capacitor 16 blocks a DC component and allows only a high frequency component to pass in a termination circuit of the high frequency signal.

Figure 3:
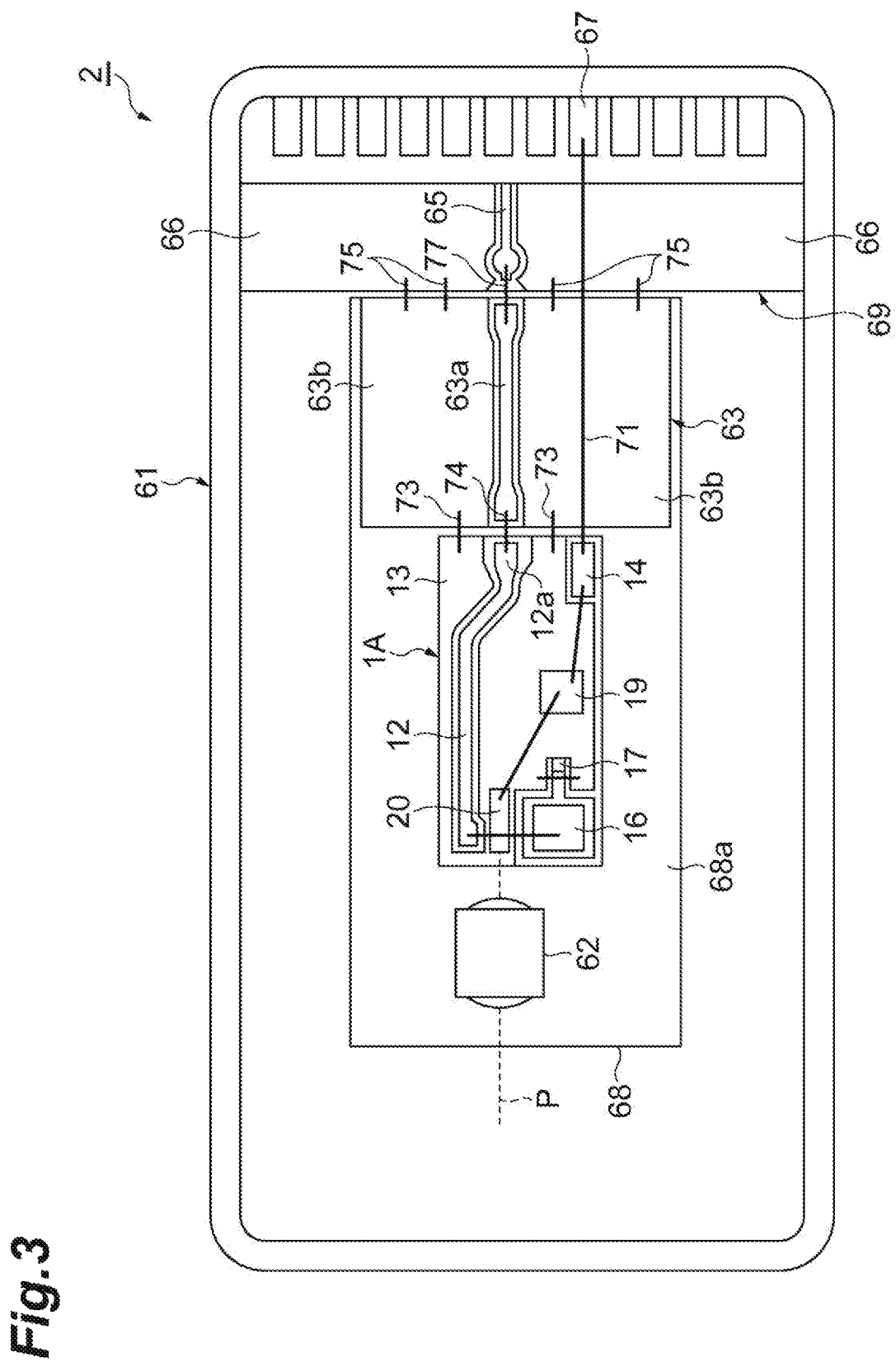
FIG. 3 is a plan view illustrating a configuration example of an optical transmitter including the optical semiconductor device illustrated in FIG. 1.

FIG. 3 is a plan view illustrating a configuration example of an optical transmitter 2 including the optical semiconductor device 1A. The optical transmitter 2 includes a package 61, a lens 62, a wiring board 63, and a thermoelectric cooler (TEC) 68 in addition to the optical semiconductor device 1A. The package 61 is a substantially rectangular parallelepiped box body and accommodates the optical semiconductor device 1A, the lens 62, and the wiring board 63. At the rear end of the package 61, terminals 67 extending from the lead terminals are arranged side by side. A signal line 65 and a ground pattern 66 constituting a coplanar line are provided on a feed-through 69 provided at the rear end of the package 61.

The TEC 68 is provided on the bottom surface of the package 61. The TEC 68 is a member that controls the temperature of components provided on the upper surface according to a drive power supplied from the outside of the optical transmitter 2. An electrically insulating plate 68a is provided on the upper surface of the TEC 68. A metal pattern corresponding to the size and shape of the back surface of the optical semiconductor device 1A, a metal pattern corresponding to the size and shape of the back surface of the lens 62, and a metal pattern corresponding to the size and shape of the back surface of the wiring board 63 are provided on the plate 68a. The optical semiconductor device 1A is mounted on the plate 68a by bonding the back surface to a metal pattern on the plate 68a via a conductive adhesive. Similarly, the lens 62 and the wiring board 63 are mounted on the plate 68a by bonding the back surfaces to the respective metal patterns on the plate 68a via a conductive adhesive.

The lens 62 is optically coupled to a light emitting end face of the semiconductor laser chip 20 and collimates a laser beam P emitted from the semiconductor laser chip 20. The collimated laser beam P is output to the outside of the package 61 through a light output port (not illustrated).

The wiring board 63 is arranged between the optical semiconductor device 1A and the feed-through 69. A signal line 63a and a ground pattern 63b constituting a coplanar line are provided on the wiring board 63. The signal line 63a extends in the vertical direction, and one end thereof is electrically connected to the pad 12a of the signal line 12 of the optical semiconductor device 1A via a bonding wire 74. The other end of the signal line 63a is electrically connected to the signal line 65 of the feed-through 69 via a bonding wire 77. A drive signal is provided to the signal line 65 of the feed-through 69 from the outside of the package 61 via a lead pin (not illustrated).

The ground patterns 63b are provided on both sides of the signal line 63a with a predetermined interval, and one ends thereof are electrically connected to the ground pattern 13 of the optical semiconductor device 1A via the bonding wires 73. The other ends of the ground patterns 63b are electrically connected to the ground patterns 66 of the feed-through 69 via the bonding wires 75. The ground patterns 66 of the feed-through 69 are electrically connected to a ground wiring outside the package 61 via lead pins (not illustrated).

The bias pattern 14 is electrically connected to one terminal 67 via the bonding wire 71. A bias voltage is applied to the terminal 67 from the outside of the package 61 via a lead pin (not illustrated).

The effects obtained by the optical semiconductor device 1A of the embodiment described above will be described. In the optical semiconductor device 1A, the semiconductor laser chip 20 is mounted on the surface 10a of the carrier 10, a high-frequency drive signal is supplied to the semiconductor laser chip 20 via the coplanar line 11 and the bonding wire 18a. In order to terminate the high frequency signal path, the capacitor 16 and the thin film resistor 17 are provided on the surface 10a of the carrier 10. The distal end of the bonding wire 18a extending from the coplanar line 11 to the semiconductor laser chip 20 further extends onto the capacitor 16 and is connected to one electrode of the capacitor 16. The other electrode of the capacitor 16 is connected to the ground pattern 13 via the mounted pattern 15 and the thin film resistor 17.

Figure 10:
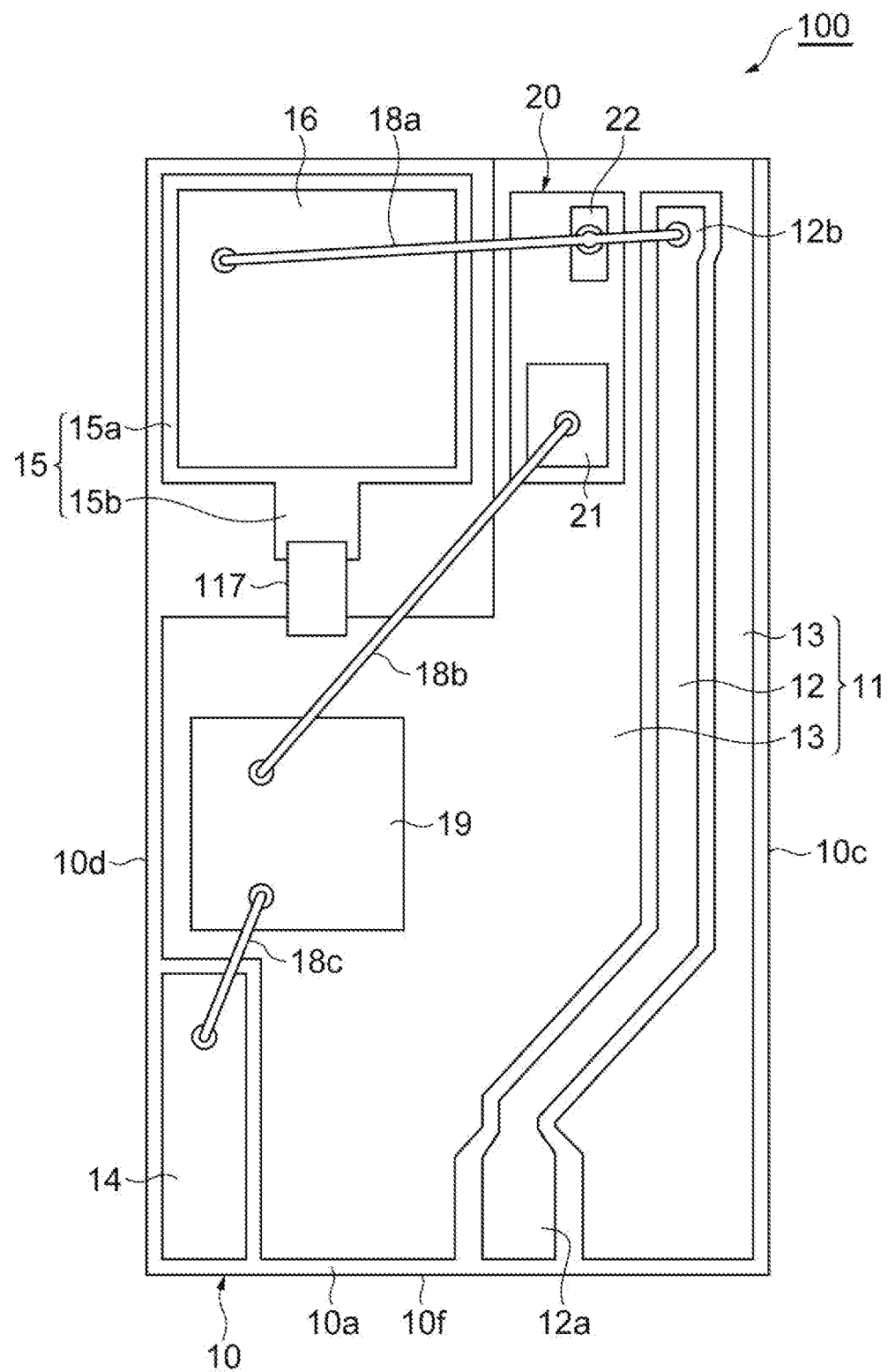
FIG. 10 is a plan view illustrating the optical semiconductor device according to the Comparative Example.

In the optical semiconductor device 1A, the intervals of the gap between the mounted pattern 15 connected to the capacitor 16 and the ground pattern 13 and the gap between the thin film resistor 17 connected to the capacitor 16 and the ground pattern 13 greatly affect the EO characteristic. FIG. 10 is a plan view illustrating an optical semiconductor device 100 according to Comparative Example. The difference between the optical semiconductor device 100 and the optical semiconductor device 1A of the embodiment is the shape of the ground pattern. That is, unlike the ground pattern 13 of the optical semiconductor device 1A, the ground pattern 13 of the optical semiconductor device 100 does not include the pair of extension ground patterns 13a and 13b. Therefore, the gap between the protrusion portion 15b of the mounted pattern 15 and the ground pattern 13 of Comparative Example is significantly larger than the gap between the main region 15a and the ground pattern 13 of the optical semiconductor device 1A. In the optical semiconductor device 100, the lateral width of the resistor 117 is smaller than the lateral width of the protrusion portion 15b. Therefore, the gap between the resistor 117 and the ground pattern 13 is larger than the gap between the protrusion portion 15b and the ground pattern 13.

Figure 4:
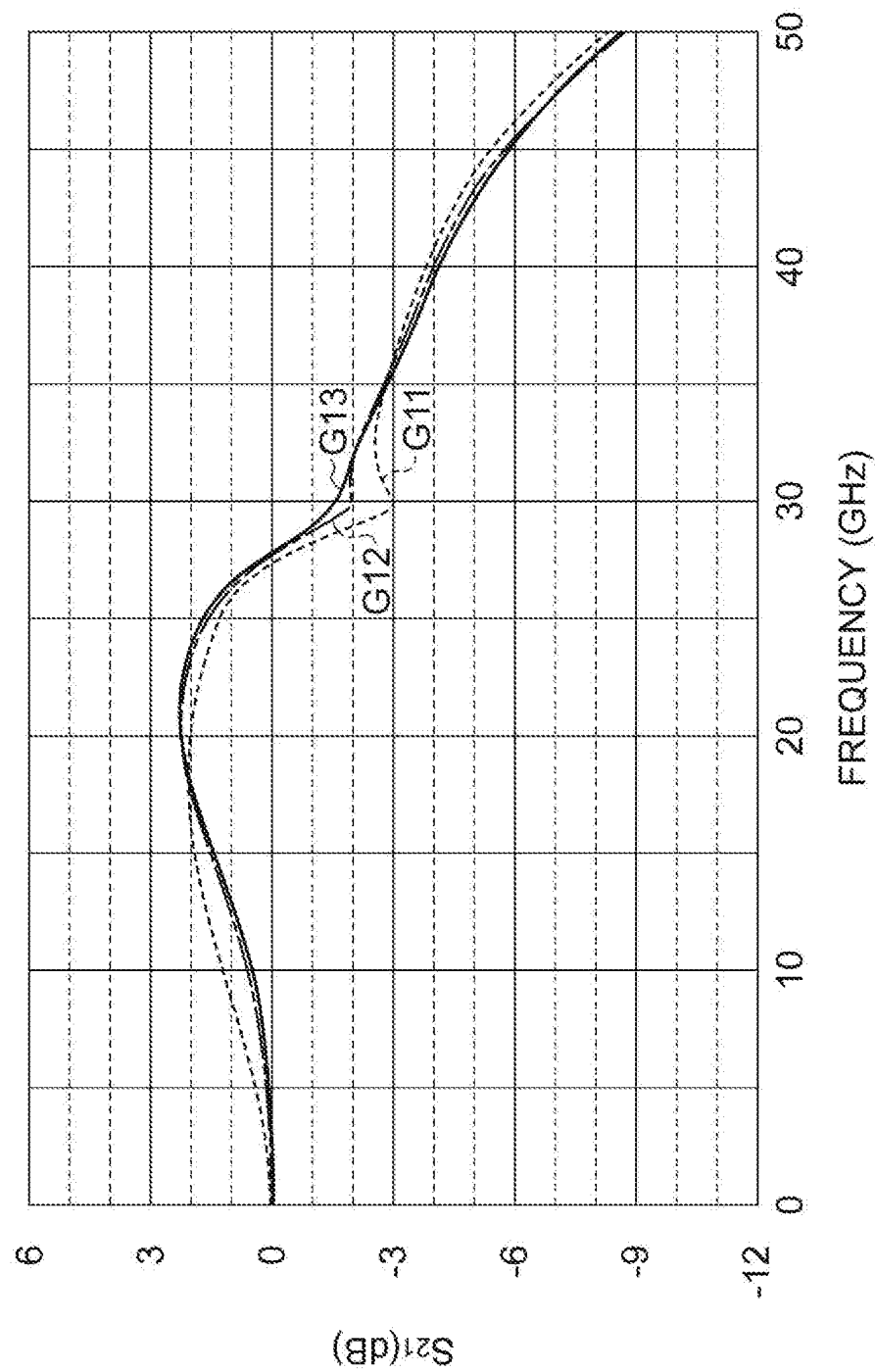
FIG. 4 is a graph showing simulation results of $S_{21}$ characteristics of the embodiment and Comparative Example.

FIG. 4 is a graph showing simulation results of $S_{21}$ characteristics of the embodiment and Comparative Example. In FIG. 4, the vertical axis represents an $S_{21}$ characteristic (unit: dB), and the horizontal axis represents frequency (unit: GHz). A graph G11 in FIG. 4 shows a characteristic of Comparative Example (refer to FIG. 10), a graph G12 shows a characteristic of the embodiment (refer to FIG. 2 in a case where the bonding wire 18d is not provided), and a graph G13 shows a characteristic of the embodiment (refer to FIG. 1 in a case where the bonding wire 18d is provided). Referring to FIG. 4, it can be understood that, in Comparative Example (graph G11), a dip in the $S_{21}$ characteristic occurs near 30 GHz. On the other hand, in the embodiment (graph G12 in a case where the bonding wire 18d is not provided), the dip in the $S_{21}$ characteristic is alleviated as compared with Comparative Example. Then, in the embodiment (graph G13 in a case where the bonding wire 18d is provided), the dip in the $S_{21}$ characteristic is further alleviated. Although the width of the gap is set to be constant at 40 μm in FIG. 4, equivalent simulation results were obtained within the range of 20 μm or more and 60 μm or less.

Figure 5A:
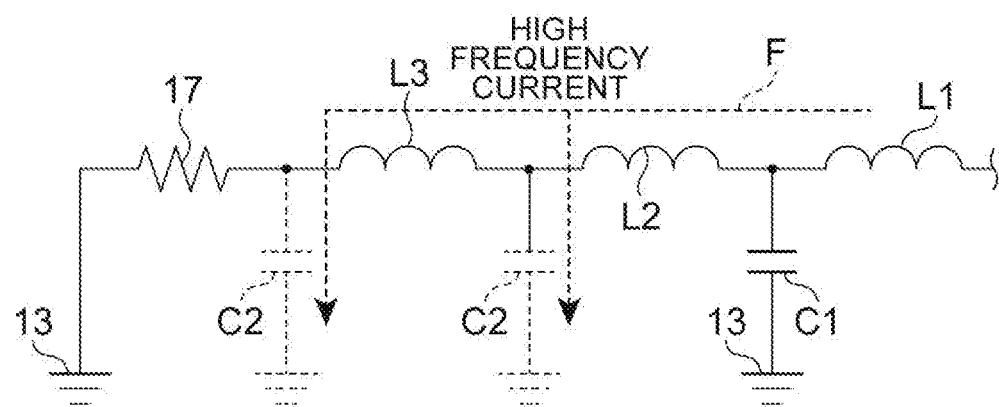
FIG. 5A is a diagram illustrating an equivalent circuit in the vicinity of a capacitor of an optical semiconductor device of the Comparative Example.
Figure 5B:
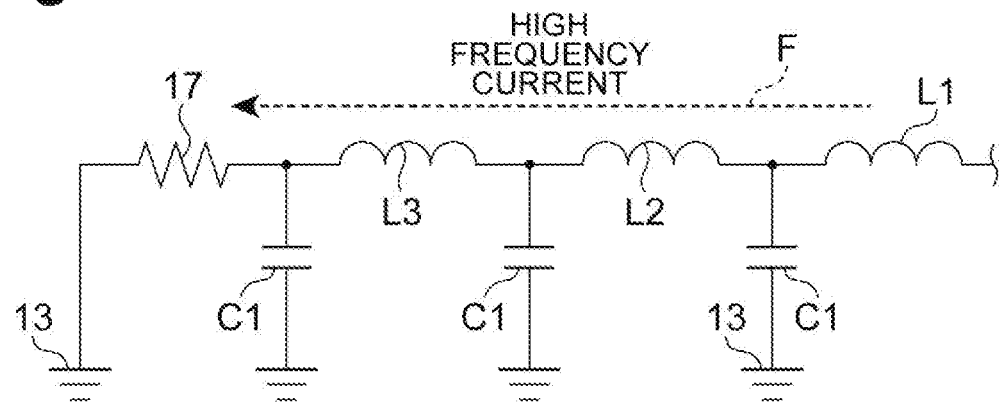
FIG. 5B is a diagram illustrating an equivalent circuit in the vicinity of a capacitor of the optical semiconductor device of the embodiment.

FIGS. 5A and 5B are diagrams illustrating an equivalent circuit in the vicinity of the capacitor 16 in order to describe the functions of the embodiment. In FIGS. 5A and 5B, inductors L1 to L3 simulate the inductance of the mounted pattern 15, and a capacitance C1 is a parasitic capacitance generated by the gap between the main region 15a of the mounted pattern 15 and the ground pattern 13. As illustrated in FIG. 5A, in Comparative Example, since the gap between the mounted pattern 15 and the ground pattern 13 and the gap between the resistor 117 and the ground pattern 13 are partially greatly vacant, a stray capacitance C2 is generated in the portion. When a high frequency current F flows, resonance occurs due to the stray capacitance C2. It is considered that high-frequency loss (leakage) occurs due to this resonance, and the EO characteristic partially dips (becomes discontinuous) as shown by a graph G11 in FIG. 4. Therefore, in Comparative Example, the flatness of the EO characteristic is impaired.

On the other hand, in the optical semiconductor device 1A of the embodiment, for example, by providing the pair of extension ground patterns 13a and 13b to the ground pattern 13, the gap between the mounted pattern 15 and the ground pattern 13 and the gap between the thin film resistor 17 and the ground pattern 13 are allowed to be uniform. Specifically, the width Wa of the gap between the mounted pattern 15 and the ground pattern 13 except for the region where the thin film resistor 17 is provided and the width Wb of the gap between the thin film resistor 17 and the ground pattern 13 except for the portions connected to each other are set to 20 μm or more and 60 μm or less at any position of the gaps. Accordingly, as illustrated in FIG. 5B, the stray capacitance C2 becomes the parasitic capacitance C1 having a constant size. Accordingly, it is considered that the electric field strength becomes constant over the entire path of the high frequency current F, and the resonance phenomenon described above is alleviated, so that the high-frequency loss is reduced. In the optical semiconductor device 1A, if the gap between the resistor and the ground pattern 13 is 20 μm or more and 60 μm or less, a resistor other than the thin film resistor 17 such as a chip resistor may be used.

According to the optical semiconductor device 1A of the embodiment, as described above, it is possible to reduce the dip in the EO characteristic, and it is possible to reduce the discontinuity points, so that the EO characteristic can be close to more flat.

As in the embodiment, the mounted pattern 15 may include the main region 15a on which the capacitor 16 is mounted and the protrusion portion 15b protruding from the main region 15a toward the thin film resistor 17, and the ground pattern 13 may include the pair of extension ground patterns 13a and 13b located on both sides of the protrusion portion 15b. From the viewpoint of manufacturing, the protrusion portion 15b protrudes toward the thin film resistor 17. The purpose thereof is (1) providing manufacturing margins on both sides of the thin film resistor 17 and (2) adding a brazing material flow stop (TaN) at the time of mounting the capacitor 16. In a case where the protrusion portion 15b protrudes toward the thin film resistor 17, the ground pattern 13 includes the pair of extension ground patterns 13a and 13b located on both sides of the protrusion portion 15b to stabilize the high frequency characteristic of the protrusion portion 15b, and thus, the dip in the EO characteristic can be further reduced.

As in the example illustrated in FIG. 1, the optical semiconductor device 1A may include the bonding wire 18d that electrically connects the pair of extension ground patterns 13a and 13b to each other across the protrusion portion 15b. In this case, the high frequency characteristic in the protrusion portion 15b is further stabilized, and thus, it is possible to more effectively reduce the dip in the EO characteristic.

As in the embodiment, the capacitance of the capacitor 16 may be 90 nF or more and 120 nF or less. In such an capacitor having a relatively large capacitance, the size of the capacitor also becomes large, and the mounted pattern 15 also becomes wide. In that case, in Comparative Example of FIG. 10, the gap between the mounted pattern 15 and the ground pattern 13 is further expanded partially. The effect of the optical semiconductor device 1A of the embodiment is particularly effective in such a case.

Modified Example 1

Figure 6:
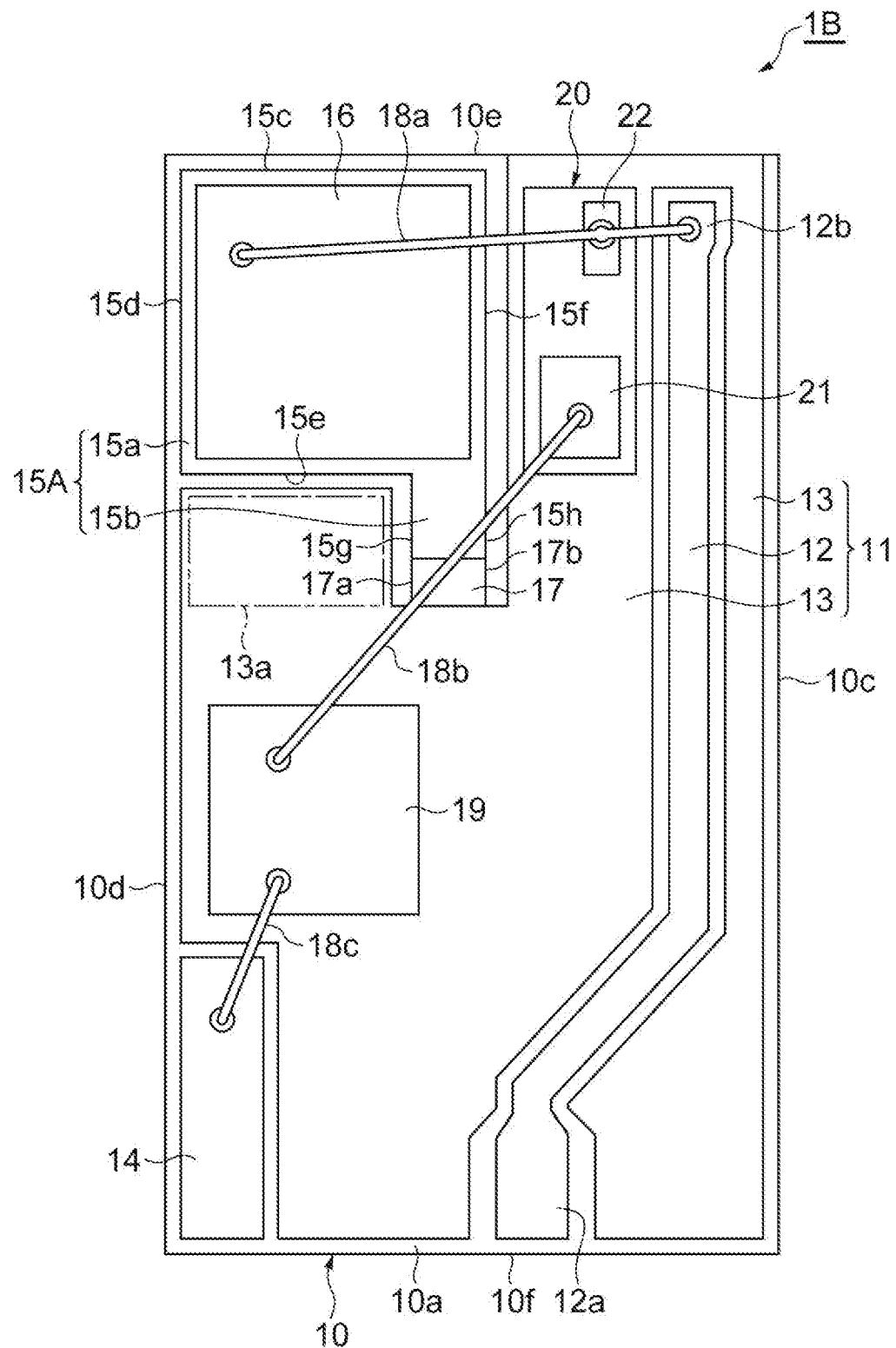
FIG. 6 is a plan view illustrating an optical semiconductor device according to a modified example.
Figure 7:
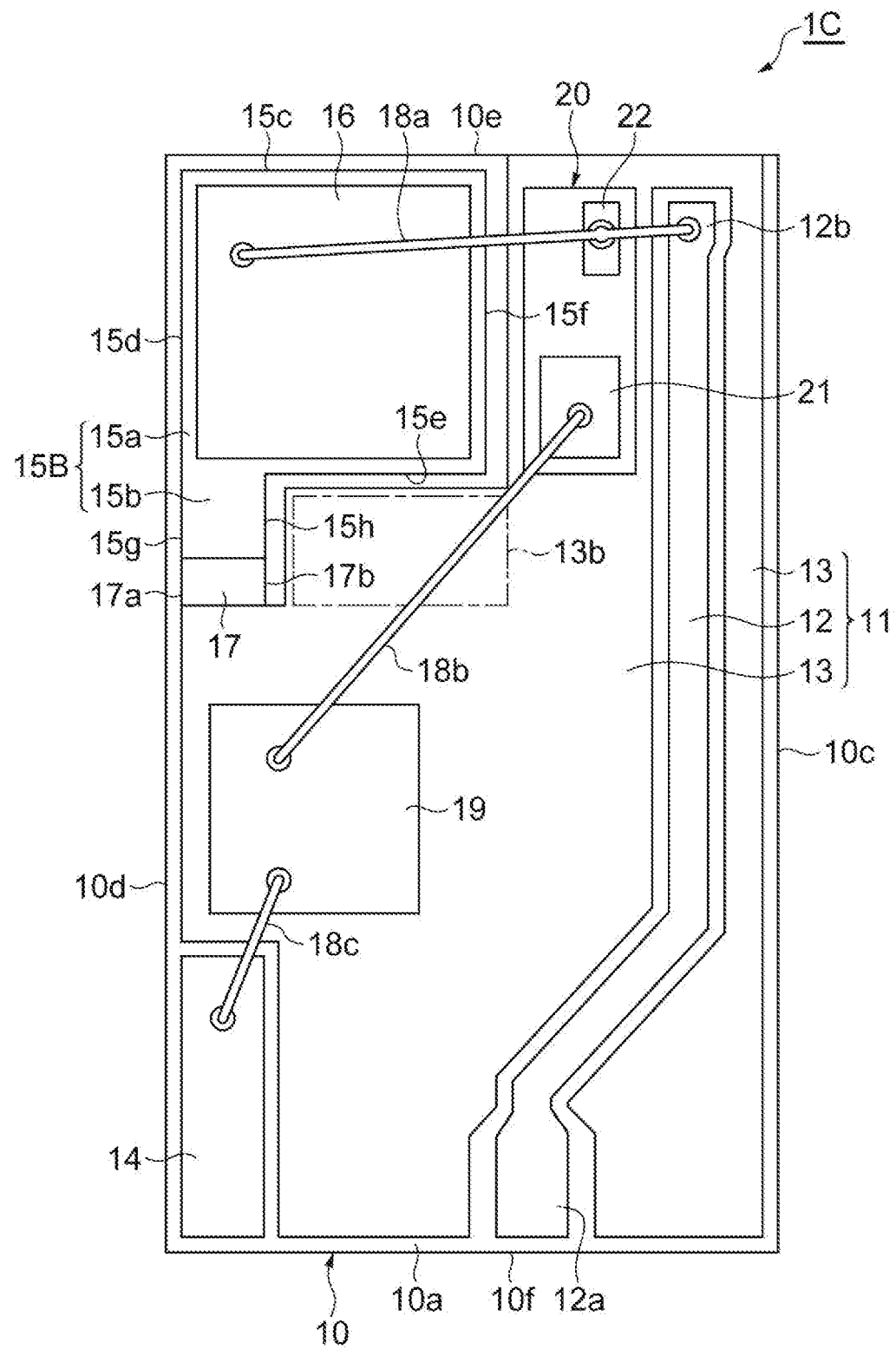
FIG. 7 is a plan view illustrating an optical semiconductor device according to a modified example.

FIGS. 6 and 7 are plan views illustrating optical semiconductor devices 1B and 1C according to a modified example of the above-described embodiment, respectively. The difference between the optical semiconductor devices 1B and 1C and the optical semiconductor device 1A of the above-described embodiment is the planar shape of the mounted pattern and the planar shape of the ground pattern.

As illustrated in FIG. 6, in a mounted pattern 15A of the optical semiconductor device 1B, the protrusion portion 15b protrudes from not a central portion of the side 15e in the main region 15a but a portion near the side 15f (in the illustrated example, the end portion of the side 15e closer to the side 15f). In this case, a width of a gap between the main region 15a of the mounted pattern 15A and the ground pattern 13 and a width of a gap between the protrusion portion 15b and the ground pattern 13 are constant. Since the thin film resistor 17 is disposed on an extension of the protrusion portion 15b, a width of a gap between the thin film resistor 17 and the ground pattern 13 approximates the width of the gap between the main region 15a of the mounted pattern 15A and the ground pattern 13 and the width of the gap between the protrusion portion 15b of the mounted pattern 15A and the ground pattern 13. Thus, a difference between parasitic capacitances in the above gaps becomes small. Accordingly, it is possible to reduce the dip in the EO characteristic. The ground pattern 13 includes the extension ground pattern 13a located on one side of the protrusion portion 15b and on one side of the thin film resistor 17 in the lateral direction. The extension ground pattern 13a is provided between the protrusion portion 15b and the side face 10d of the carrier 10 and between the thin film resistor 17 and the side face 10d of the carrier 10. Accordingly, it is possible to further improve the EO characteristic by providing the ground pattern 13a.

As illustrated in FIG. 7, in the mounted pattern 15B of the optical semiconductor device 1C, the protrusion portion 15b protrudes from not a central portion of the side 15e in the main region 15a but a portion near the side 15d (in the illustrated example, the end portion of the side 15e closer to the side 15d) and is next to the side face 10d. The ground pattern 13 includes the extension ground pattern 13b located on one side of the protrusion portion 15b and on one side of the thin film resistor 17 in the lateral direction. The extension ground pattern 13b is provided at a position interposing the protrusion portion 15b and the thin film resistor 17 between the extension ground pattern 13b and the side face 10d of the carrier 10.

Also in this modified example, the width of the gap between the mounted patterns 15A and 15B and the ground pattern 13 is 20 μm or more and 60 μm or less at any position of the gap except for the region where the thin film resistor 17 is provided. In one example, the widths are all set to a constant size. The width of the gap between the thin film resistor 17 and the ground pattern 13 is 20 μm or more and 60 μm or less at any position of the gap except for the portions connected to each other. In one example, the widths are all set to a constant size. In FIGS. 6 and 7, as long as the width of the gap between each of the protrusion portion 15b and the thin film resistor 17 and the extension ground pattern 13a (13b) is 20 μm or more and 60 μm or less, the lateral widths (widths in the direction intersecting the side edge) of the protrusion portion 15b and the thin film resistor 17 may be different from each other. For example, the lateral width of the protrusion portion 15b may be larger or smaller than the lateral width of the thin film resistor 17.

Figure 8:
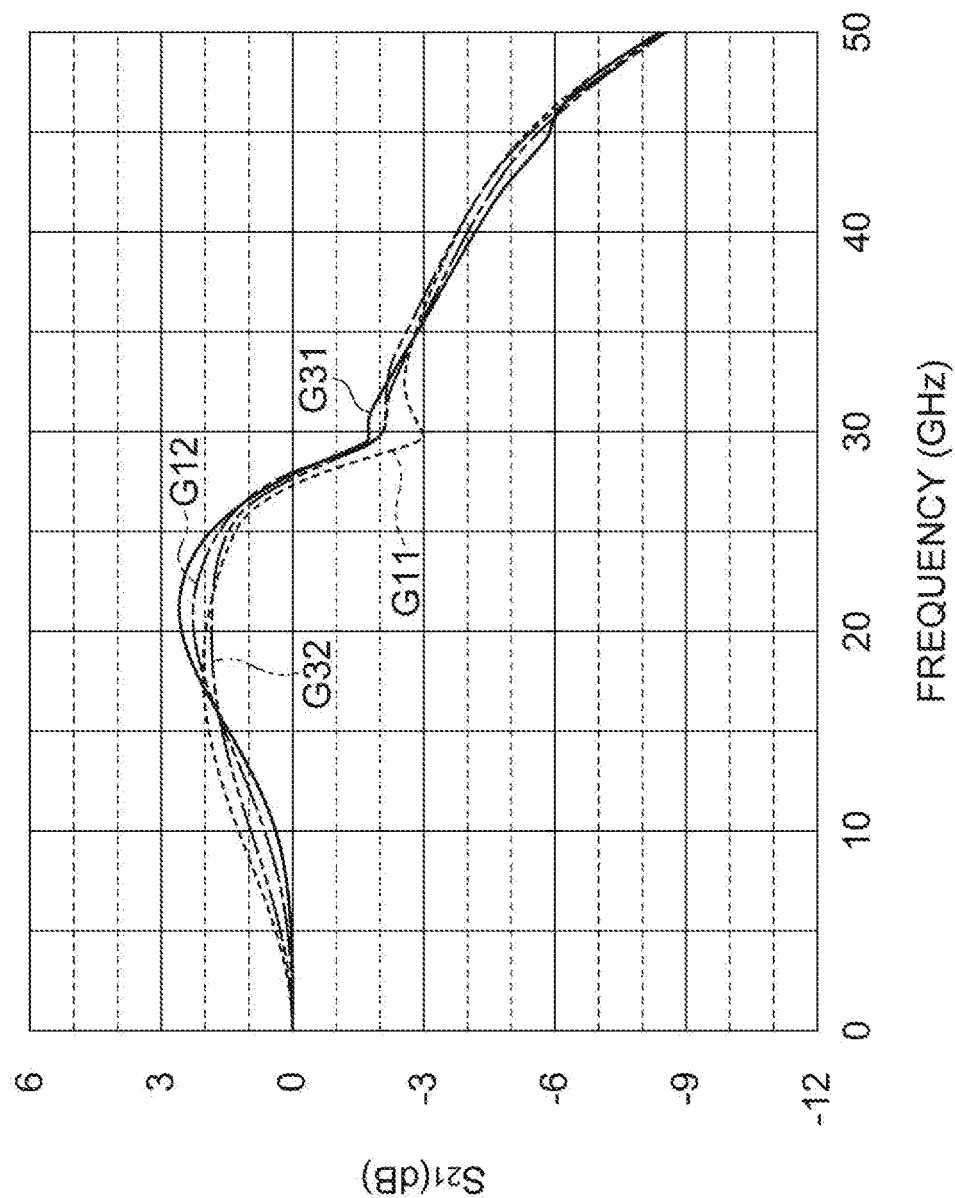
FIG. 8 is a graph showing simulation results of $S_{21}$ characteristics in Modified Example 1.

As in this modified example, the protrusion portion 15b may protrude from any position of the main region 15a in the lateral direction. Even in this case, it is possible to obtain the same effect as that of the above-described embodiment. FIG. 8 is a graph showing simulation results of $S_{21}$ characteristics in this modified example. In FIG. 8, the vertical axis represents an $S_{21}$ characteristic (unit: dB), and the horizontal axis represents a frequency (unit: GHz). A graph G31 in FIG. 8 shows the characteristic of the optical semiconductor device 1B (refer to FIG. 6), and a graph G32 shows the characteristic of the optical semiconductor device 1C (refer to FIG. 7). Referring to FIG. 8, it can be understood that, also in this modified example, similarly to the above-described embodiment (graph G12), the dip in the $S_{21}$ characteristic is alleviated as compared with Comparative Example (graph G11).

Modified Example 2

Figure 9:
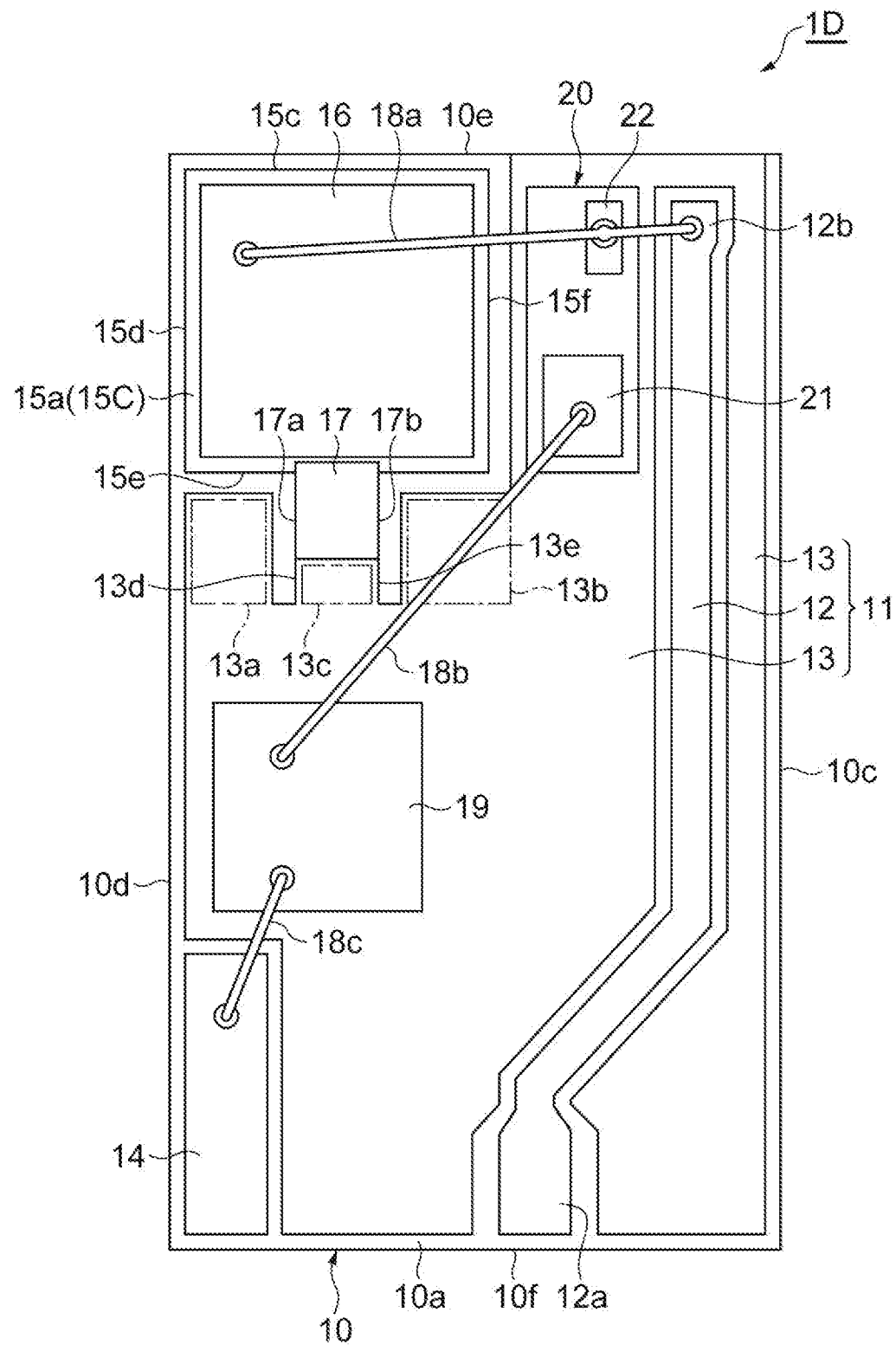
FIG. 9 is a plan view illustrating an optical semiconductor device according to Modified Example 2.

FIG. 9 is a plan view illustrating an optical semiconductor device 1D according to another Modified Example of the above-described embodiment. The difference between the optical semiconductor device 1D and the optical semiconductor device 1A of the above-described embodiment is the planar shape of the mounted pattern and the ground pattern. As illustrated in FIG. 9, a mounted pattern 15C of the optical semiconductor device 1D includes only the main region 15a and does not include the protrusion portion 15b. Therefore, the mounted pattern 15C has a planar shape such as a square shape or a rectangular shape. The ground pattern 13 of this modified example includes a protrusion portion 13c in addition to the pair of extension ground patterns 13a and 13b. The protrusion portion 13c protrudes toward the thin film resistor 17 between the pair of extension ground patterns 13a and 13b. The thin film resistor 17 is provided between the mounted pattern 15C and the protrusion portion 13c of the ground pattern 13. Specifically, one end of the thin film resistor 17 is connected to the mounted pattern 15C, and the other end of the thin film resistor 17 is connected to the protrusion portion 13c of the ground pattern 13.

The pair of extension ground patterns 13a and 13b of the ground pattern 13 are provided on both sides of the thin film resistor 17 and the protrusion portion 13c in the lateral direction. One side of the extension ground pattern 13a faces the side edge 17a of the thin film resistor 17 and the side edge 13d of the protrusion portion 13c and extends along the side edges 17a and 13d. One side of the extension ground pattern 13b faces the side edge 17b of the thin film resistor 17 and the side edge 13e of the protrusion portion 13c and extends along the side edges 17b and 13e.

Also in this modified example, the width of the gap between the mounted pattern 15C and the ground pattern 13 is 20 μm or more and 60 μm or less at any position of the gap except for the region where the thin film resistor 17 is provided. In one example, the widths are all set to a constant size. In addition, the width of the gap between the thin film resistor 17 and the ground pattern 13 is 20 μm or more and 60 μm or less at any position of the gap except for the portions connected to each other. In one example, the widths are all set to a constant size.

In addition, as long as the width of the gap between each of the protrusion portion 13c and the thin film resistor 17 and the extension ground pattern 13a (13b) is 20 μm or more and 60 μm or less, the lateral widths (widths in the direction intersecting the side edge) of the protrusion portion 13c and the thin film resistor 17 may be different from each other. For example, the lateral width of the protrusion portion 13c may be larger or smaller than the lateral width of the thin film resistor 17.

As in this modified example, a portion protruding toward the thin film resistor 17 may be provided on the ground pattern instead of the mounted pattern. Then, the thin film resistor 17 may be directly connected to the main region 15a of the mounted pattern. Even in this case, it is possible to obtain the same effect as that of the above-described embodiment.

The optical semiconductor device according to the disclosure is not limited to the above-described embodiments and examples, and various modifications are available. For example, in the above-described embodiment, an indirect modulation method using a laser diode and an optical modulator is exemplified, but the disclosure can be applied to a direct modulation method that drives a laser diode. In that case, a signal line of a coplanar line is connected to an electrode of the laser diode.

What is claimed is:

1. An optical semiconductor device comprising:
   a semiconductor laser chip;
   an insulation substrate having a surface mounting the semiconductor laser chip thereon;
   a ground pattern provided on the surface;
   a mounted pattern provided on the surface, the mounted pattern having an opposite side opposite to the ground pattern;
   a resistor disposed such that a side edge of the resistor separates from an extension region of the opposite side;
   an extension ground pattern positioned in the extension region of the opposite side, the extension ground pattern being electrically connected to the ground pattern; and
   a capacitor disposed on the mounted pattern,
   wherein the extension ground pattern is a pair of extension ground patterns, and the pair of extension ground patterns sandwich the resistor therebetween.

2. The optical semiconductor device according to claim 1, further comprising:

a bonding wire that connects the pair of extension ground patterns positioned at both sides of the resistor to each other.

3. The optical semiconductor device according to claim 1, wherein a protrusion portion having a narrower width than the ground pattern is disposed between the ground pattern and the resistor.

4. The optical semiconductor device according to claim 1, wherein one end of the resistor is electrically connected to the mounted pattern and the other end of the resistor is electrically connected to a protrusion portion extended from the ground pattern, the protrusion portion having a narrower width than the mounted pattern.

5. An optical semiconductor device comprising: a semiconductor laser chip; an insulation substrate having a surface mounting the semiconductor laser chip thereon; a ground pattern provided on the surface; a mounted pattern provided on the surface, the mounted pattern comprising a main region and a protrusion portion having a narrower width than the main region, wherein the protrusion portion has a side edge on an extension of an opposite side of the main region opposite to the ground pattern; a resistor disposed on an extension of the protrusion portion wherein a side of the resistor is opposite to the ground pattern; a capacitor disposed on the main region of the mounted pattern; and an extension ground pattern disposed to be opposite to the ground pattern so as to sandwich the protrusion portion and the resistor therebetween, the extension ground pattern being electrically connected to the ground pattern.

6. A carrier comprising:

an insulation substrate having a surface configured to mount a semiconductor laser chip thereon;

a ground pattern provided on the surface;

a mounted pattern provided on the surface, the mounted pattern having an upper surface configured to dispose a capacitor thereon and an opposite side opposite to the ground pattern;

a region configured to dispose a resistor that is connected to the mounted pattern thereon; and an extension ground pattern positioned on an extension region of the opposite side, the extension ground pattern being electrically connected to the ground pattern, wherein the extension ground pattern is a pair of extension ground patterns, and the pair of extension ground patterns sandwich the region where the resistor is disposed therebetween.

7. The carrier according to claim 6, wherein an extension portion having a narrower width than the mounted pattern is disposed between the mounted pattern and the region where the resistor is disposed.

8. A carrier comprising:

an insulation substrate having a surface configured to mount a semiconductor laser chip thereon;

a ground pattern provided on the surface;

a mounted pattern provided on the surface, the mounted pattern comprising an upper surface configured to dispose a capacitor thereon, a main region, and a protrusion portion having a narrower width than the main region, wherein the protrusion portion has a side edge on an extension of an opposite side of the main region opposite to the ground pattern;

a region configured to dispose a resistor thereon, the region located on an extension of the protrusion portion; and an extension ground pattern disposed to be opposite to the ground pattern so as to sandwich the region where the protrusion portion and the resistor are disposed, the extension ground pattern being electrically connected to the ground pattern.

\* \* \* \* \*